United States Patent [19]

Kalbskopf et al.

[11] 4,361,284
[45] Nov. 30, 1982

[54] NOZZLE FOR THE CONTINUOUS DEPOSITING OF A LAYER OF SOLID MATERIAL ON A SUBSTRATE

[75] Inventors: Reinhard Kalbskopf, Onex; Otto Baumberger, Carouge, both of Switzerland

[73] Assignee: Societa Italiana Vetro-Siv-S.p.A., San Salvo, Italy

[21] Appl. No.: 204,806

[22] Filed: Nov. 7, 1980

[30] Foreign Application Priority Data

Nov. 21, 1979 [CH] Switzerland ............... 10377/79

[51] Int. Cl.³ ............... B05B 7/00; B05D 1/34; C03C 17/245
[52] U.S. Cl. ............... 239/422; 118/718; 118/725; 239/433; 239/455; 427/426
[58] Field of Search ............... 239/79, 422, 423, 433, 239/455; 427/166, 255.2, 420, 426; 118/718, 725, 726, 729

[56] References Cited

U.S. PATENT DOCUMENTS 3,511,703  5/1970  Peterson ............... 117/201
3,970,037  7/1976  Sopko ............... 118/729
4,270,702  6/1981  Nicholson ............... 239/455

FOREIGN PATENT DOCUMENTS 2123274  2/1972  Fed. Rep. of Germany.
2015789  4/1970  France.
2348165  11/1977  France.

*Primary Examiner*—Andres Kashnikow
*Attorney, Agent, or Firm*—Finnegan, Henderson, Farabow, Garrett & Dunner

[57] ABSTRACT

A nozzle for depositing a layer of solid material on a heated substrate, in particular by chemical vapor deposition, comprises three supply chambers for gas, which chambers communicate with three prismatic spaces which converge towards an outlet slot divided into three by two longitudinal strips which are tensioned at both ends and are applied against support surfaces which provide the strips with their respective inclinations centered on the truncated apex of a prismatic cavity which is divided by the strips to form the prismatic spaces. This arrangement enables a uniform spacing of the outlet slots of the spaces to be maintained whatever the length of the nozzle.

7 Claims, 3 Drawing Figures

NOZZLE FOR THE CONTINUOUS DEPOSITING OF A LAYER OF SOLID MATERIAL ON A SUBSTRATE

The present invention relates to a nozzle for the continuous depositing of a layer of solid material on a substrate by the reaction of at least two reagents which are gaseous or suspended in a gas.

It has already been proposed in Swiss Pat. No. 1412/79 (U.S. Ser. No. 117086, now U.S. Pat. No. 4,294,868; Australian patent application No. 55139/80; South African patent application No. 80/0824) to carry out the continuous depositing of a layer of solid material on a relatively wide substrate by the reaction of two gaseous reagents, this substrate being in particular a flat sheet of glass. This method is known by the abbreviation C.V.D., for "Chemical Vapour Deposition". It is possible by this method to deposit thin transparent layers of $SnO_2$ or $TiO_2$ obtained from the reaction of $SnCl_4$ or $TiCl_4$ and $H_2O$ diluted in a carrier gas and brought into contact with the surface of the glass which has previously been heated to a temperature in the range of 400° C. to 600° C.

The apparatus for carrying out this method in particular comprises a nozzle having three adjacent rectilinear slots, in which the lateral walls defining the longitudinal edges of each slot converge towards a common line. The outflows formed at the outlets of these slots take the form of three separate laminar outflows which are directed onto the substrate and meet each other by mutual tangential contact. In order to cause these three outflows to contact each other tangentially, the walls separating the various slots must be extremely thin and must form, in particular at the point of discharge of these outflows, edges which are as sharp as possible. The construction of a nozzle of this type, having a length which may reach 3 meters for example, poses extremely complex manufacturing problems. It is necessary for the width of each of the slots of the nozzle to be completely constant over its entire length as, if this is not the case, the proportion of the gases distributed is not uniform and results in a non-homogeneous deposit of material. A nozzle of this type presents not only manufacturing difficulties but also difficulties in respect of its operating temperature which is approximately 110° C. and constitutes a further fact which may modify the spacing of the slots of the nozzle and in particular the uniformity of this spacing, which may seriously affect the correct application of the method.

Irregularities in the slots of the nozzle have extremely unfavourable repercussions on the quality of the deposit. In the case of an $SnO_2$ deposit, these irregularities may cause the formation of white powder on the surface of the substrate and at the outlet of the nozzle which gradually obstructs the passage of the flow. A local variation in the proportions of the reagent gases may also cause a variation of the thickness of the layer and therefore cause a play of colours on the surface of the glass. As the tin oxide layer is deposited to form an electrically conductive layer designed to heat the glass in particular for defrosting, the irregularity in thickness also results in a variation in the resistivity of the layer and thus a non-uniform distribution of heating. In the last instance, these local flow variations destroy the stoichiometric conditions of the reaction in such a way that the optimum conditions for carrying out the method are no longer obtained.

The object of the present invention is to remedy the above-mentioned drawbacks at least partially.

The present invention relates to a nozzle for the continuous depositing of a layer of a solid material on a substrate by the reaction of at least two reagents which are gaseous or suspended in a gas and contact one another in the immediate vicinity of the substrate, which has been brought to a temperature close to the reaction temperature of these reagents; the nozzle is characterised in that it has a distribution aperture constituted by a longitudinal slot, itself sub-divided into three parallel slots by two intermediate longitudinal edges, in that this nozzle is located at the truncated apex of a prismatic cavity, the intermediate edges forming two edges of two respective metal strips which extend over the entire height of this prismatic cavity, and in that support surfaces are disposed in the vicinity of each of the ends of these strips and are shaped so as to have respective inclinations passing through the truncated apex and so as to sub-divide this prismatic cavity into three substantially equal prismatic volumes, each of these volumes having at least one aperture for the admission of one of the reagents and each of the strips being connected at their respective ends to longitudinal tensioning means in order to apply them against their respective support surfaces.

The accompanying drawings are a diagrammatic representation of an embodiment of the nozzle of the invention given by way of example. In the drawings.

Figure 1:
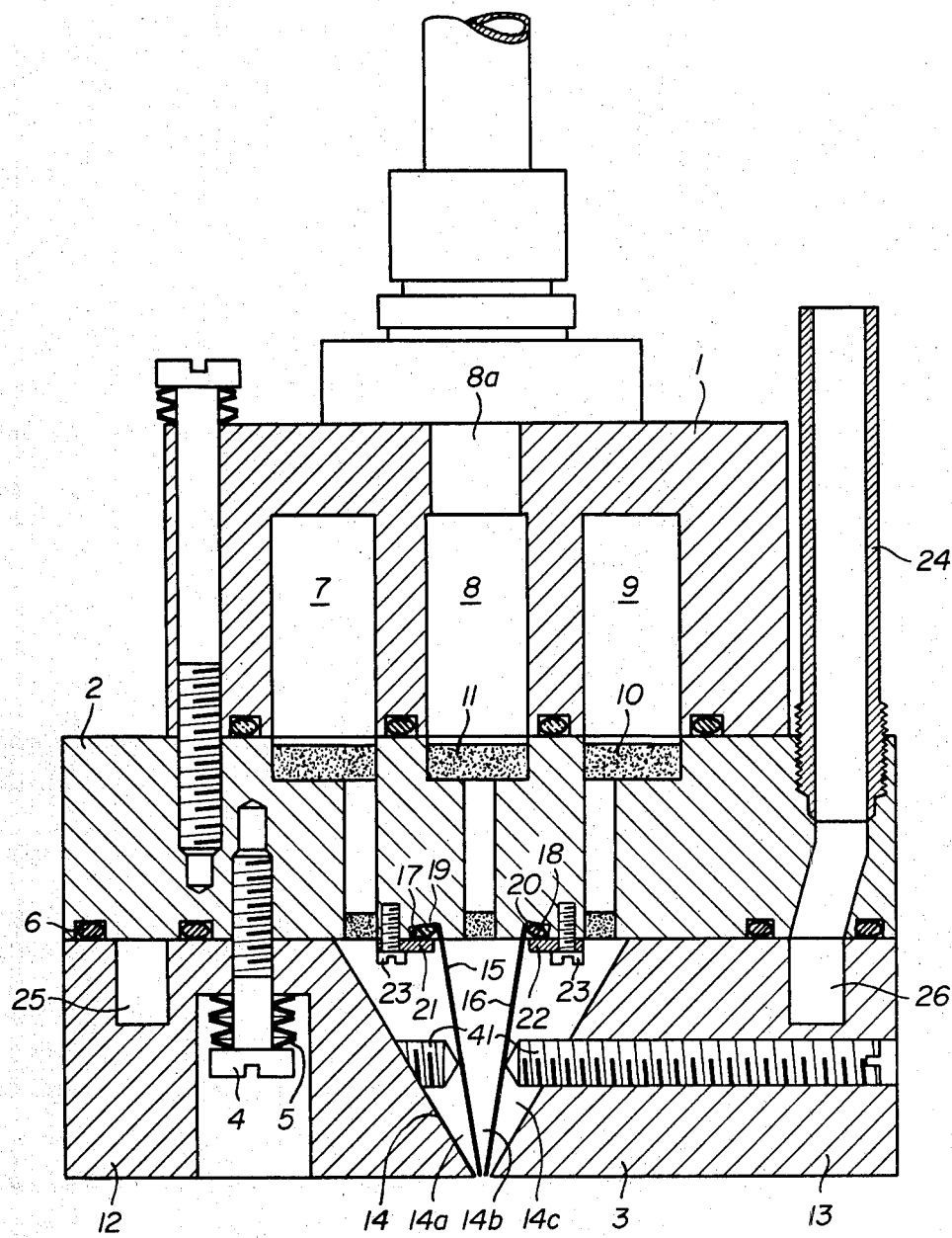
FIG. 1 is a transverse section through the nozzle.

The illustrated nozzle is designed to carry out the method disclosed in the above-mentioned patent application. The complete apparatus for supplying the nozzle with reagent gas and for displacing the substrate relative to the nozzle is not disclosed herein, as the present invention relates specifically to an embodiment of the nozzle designed to make the operational conditions of the method as close as possible to the ideal theoretical conditions even in the case of a nozzle capable of depositing a continuous coating on a substrate having a width of several meters.

In the example shown, the body of the nozzle is formed from three elements, these being an inlet or supply element 1, a distribution element 2 and an outlet element 3, the supply element 1 and the outlet element 3 being resiliently connected to the distribution element 2 by screws 4. The screws are screwed tight, into the distribution element 2 and "Belleville" conical spring washers 5 are placed between the screw heads and the elements 1 and 3. Seals 6 are disposed between these assembled components.

The supply element 1 of the nozzle comprises three chambers 7, 8 and 9 each of which extends over the entire length of the body of the nozzle and has an inlet; only the inlet 8a of chamber 8 is visible in FIG. 1 because these inlets are longitudinally offset to permit attachment of their respective supply conduits. The distribution element comprises a plurality of vertical passages 10 connecting each chamber 7, 8 and 9 to the outlet element 3. Packings 11 of open pore foam made of Teflon (Registered Trademark) are disposed in front of the inlets and at the outlets of the vertical passage 10. These packings are designed to create high head losses in order to provide a uniform distribution of the gases over the entire length of the nozzle body. The foam is resistant to corrosion and to the operating temperature of about 110° C.

The outlet element comprise two profiled bars 12 and 13 having vertical cross sections each in the form of a right-angled trapezium, which are disposed in mirror symmetry relative to the vertical median plane of the nozzle body with the acute angles of their vertical sections adjacent to this median plane. The inclined faces of these two trapeziums define between them a prismatic cavity 14, the third side of this cavity being closed by the lower surface of the distribution element 2. The outlets of the three parallel sets of passages 10 communicate with the portion of the lower face of the distribution element 2 which closes the prismatic cavity 14.

This cavity 14 is sub-divided into three by two metal strips 15 and 16 which extend longitudinally over the entire length of the prismatic cavity 14 and extend transversely from the side of the cavity 14 formed by the lower face of the distribution element 2 in the direction of the apex of the prism opposite to this face. However, this cavity 14 is formed by a prism whose apex, adjacent to the two inclined faces of the two right-angled trapeziums constituted by the vertical cross sections of the bars 12 and 13, is truncated, the two edges formed by the acute angles of these trapeziums being spaced from and parallel to one another. As the strips 15 and 16 extend transversely toward the truncated apex of the prismatic cavity 14, their edges terminate between the spaced edges of the bars 12 and 13 and thus form three parallel outlet slots each located at the outlet of one of the prismatic volumes 14a, 14b and 14c defined in the cavity 14 by the strips 15 and 16. These three volumes 14a, b and c are substantially equal and the strips 15 and 16 are disposed in such a way that each volume 14a, b, c communicates through one of the sets of passages 10 with the chamber 7, 8 or 9 respectively. Each volume 14a, b, c is separated from the adjacent volume in a leak-tight manner by a seal 17 or 18 disposed in a longitudinal groove 19 or 20 into each of which is introduced one of the longitudinal edges of the respective strip 15, 16.

Two locking strips 21 and 22 fixed by screws 23 press the respective seals 17, 18 into the seats 19 and 20. As a result of this the longitudinal edges of the strips 15 and 16 are locked against the edges of the seats 19, 20 and the seals 17 and 18.

The nozzle body is also traversed by an oil circulation circuit having an inlet conduit 24 and two longitudinal circulation ducts 25 and 26 provided in the profiled bars 12 and 13. This oil circulation is connected to an external heat stabilisation system for the nozzle body so as to maintain its temperature at approximately 110° C.

Figure 2:
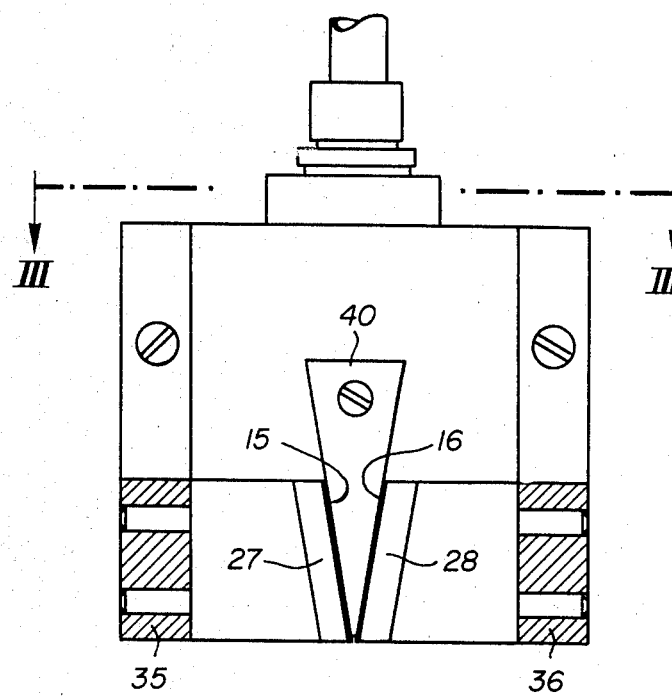
FIG. 2 is a transverse section at one of the longitudinal ends of the nozzle.
Figure 3:
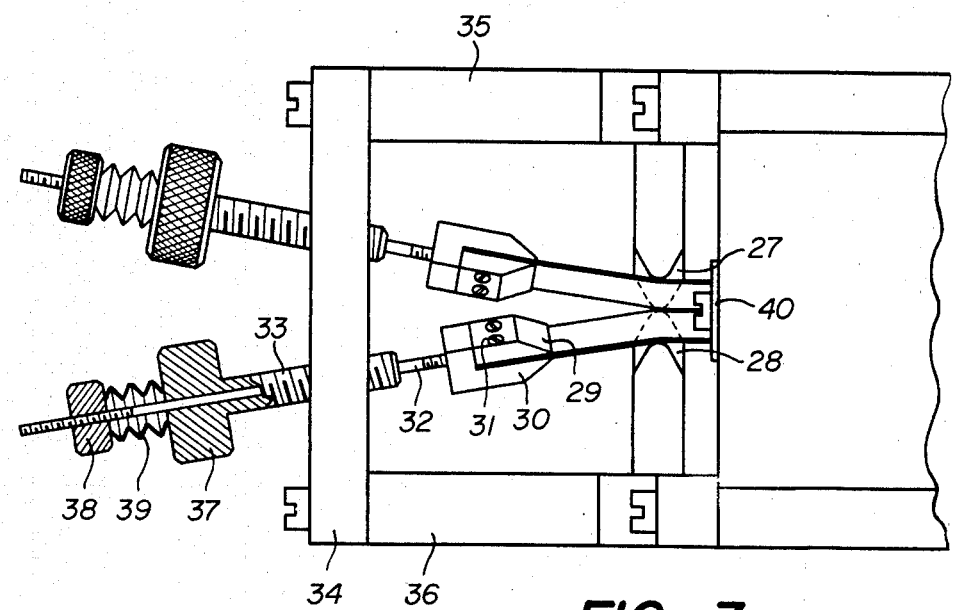
FIG. 3 is a view along the line III—III of FIG. 2.

FIGS. 2 and 3 show the means for guiding and fastening the strips 15 and 16 at the two ends of the nozzle body. Each strip 15, 16 rests on a support surface 27, 28 designed to provide the strips 15, 16 with their respective inclinations in such a way that they divide the prismatic cavity 14 into three substantially equal volumes and such that, transversely, these strips are orientated in such a way that they are aligned on the truncated apex of the prismatic cavity 14 so that the edges of these strips define three parallel slots having the same width, between the edges of the profiled sections 12 and 13. The opposite ends of the strips 15 and 16 rest on two identical guiding surfaces disposed at the other end of the nozzle body. These guiding surfaces 27 and 28 are fixed perpendicularly to two side walls 35, 36 which prolong the nozzle body.

Each end of each strip is locked between two jaws 29, 30 fixed by screws 31. As the system of fastening is identical for the four ends of the two strips, only one of these fastenings will be described. One of the jaws 30 is rigid with a threaded rod 32, which is freely engaged through a tube 33 which is threaded externally. This tube 33 is screwed into a plate 34 fixed to the two side walls 35 and 36.

The threaded openings into which the tubes 33 are screwed, are spaced on opposite sides of a vertical plane passing through the truncated apex of the prismatic cavity 14, and form an angle with this plane such that the apex of this angle is located substantially at the guiding surfaces 27 and 28. A nut 37 is fast with the tube 33, outside the space defined between the walls 35, 36 and the plate 34. A second adjustment nut 38 is screwed on the external end of the rod 32 and "Belleville" spring washers 39 are interposed between the nuts 37, 38 in order to prevent undesirable rotation of the adjustment nut 38.

A component 40 having a triangular shape, screwed on the end of the distribution element 2, is disposed between the support surfaces 27, 28 and is designed to close the end of the prismatic chamber 14.

As a result of the tension and the angle with which it is applied to the ends of the strips 15 and 16, these strips are caused to come into close contact with the support surfaces 27 and 28 and assume the same transverse inclination as that of the support surfaces. Since that the accuracy of the support surfaces may be very high, in particular in respect of inclination and centering at the truncated apex of the prismatic cavity 14, the application of the strips 15 and 16 against the surfaces under enables the strips to be accurately maintained in the same position along the entire nozzle, in such a way that the spacings of the three outlet slots provided between the edges of the profiled sections 12 and 13 is maintained uniform, irrespective of questions of dilation due to the resilient traction forces exerted on the strips.

Correction screws 41 traverse the profiled bars 12 and 13 parallel to the parallel faces of their right-angled trapezium-shaped cross sections and substantially halfway between these two faces. These screws 41 are designed to act on the strips 15 and 16. The transverse planarity of the strips 15 and 16 can not be perfect, as a result of the fact that these strips are necessarily obtained by a cutting operation. The shearing forces which occur during this operation cause a slight transverse deformation of the strip. The tensile strain exerted on the strips tends to increase this deformation between the two guiding surfaces 27, 28, by causing the strip to assume a slightly curved shape in the transverse direction of the strip. The correction screws 41 distributed along the prismatic cavity 14 are designed to act on the convexity of the strips 15 and 16, which are orientated in such a way that this convexity faces the screws 41. A slight pressure by these screws against the strip material at uniform distances along each of these strips enables the transverse planarity of the strips to be re-established without affecting the straightness of the free edges of these strips which are tensioned at both ends.

Particular care should be taken in respect of the finishing of the components to be inserted in the assembly of the prismatic cavity 14 and the longitudinal separation strips 15 and 16, in particular in respect of the surface condition of these components so as to ensure a "laminar" and tangential flow of the curtains of gas until they come into contact at the apex of the prismatic cavity 14 where the reaction is to take place and which coincides with the substrate to be coated. In addition, all the surfaces contacting the reagent gases should be of a material which is resistant to the corrosion caused by these gases. In this example, all the surfaces, including those of the strips 15 and 16, were gilded by galvanic deposit. Tests carried out with a nozzle of this type enabled coatings having an extremely satisfactory quality and uniformity to be obtained.

We claim:

1. A nozzle for the continuous deposition on a heated substrate of a layer of solid material produced by the reaction at said substrate of at least two tangentially adjacent gas streams, which nozzle comprises enclosure means defining therein a prismatic cavity having a truncated apex which forms a longitudinal outlet slot; two metal strips each extending along the prismatic cavity and over the entire height thereof, thereby dividing said cavity into three substantially equal prismatic volumes, each strip having a longitudinal edge disposed in said longitudinal slot, said edges dividing said longitudinal slot into three parallel slots; means defining at least one inlet aperture communicating with each of said prismatic volumes for admission of a respective reagent; support surfaces disposed in the vicinity of each of the strip ends, each support surface having a respective inclination such that said surface is aligned with said truncated apex, said strips having respective end regions disposed in contact with respective said support surfaces for locating said strips in alignment with said apex; and longitudinal tensioning means connected to said strips for maintaining said strips in contact with said support surfaces.

2. A nozzle as in claim 1 in which said prismatic cavity has two faces adjacent to said truncated apex, and in which a plurality of adjustable stop screws traverse said two faces, said screws being disposed to contact said strips substantially in the middle of their widths for correcting defects in the transverse planarity of the strips.

3. A nozzle as in claim 1 in which said prismatic cavity has a face opposite said truncated apex and said strips have further edges opposite said longitudinal edges disposed in said longitudinal slot, and in which leak-tight sealing means are provided for connecting said further strip edges to said opposite face of said cavity.

4. A nozzle as in claim 1 including for each said inlet aperture a layer of open-pore foam of a material resistant to corrosion and to a temperature of the order of 110° C., for ensuring uniform distribution of gases over the entire length of the prismatic volumes.

5. A nozzle as in claim 1 including resilient compression means disposed between said tensioning means and respective ends of said strips for transmitting tension to said strips.

6. A nozzle as in claim 1 in which said enclosure means comprise a gas-distribution element and an outlet element which includes two profiled longitudinal members each having a cross-section in the form of a right-angled trapezium with an acute angle, said members being disposed in mirror symmetry with their acute angles adjacent to one another, said longitudinal slot being defined between said adjacent acute angles, screws fast with the gas-distribution element, resilient compression elements disposed between said screws and said profiled members respectively for fixing said members to said distribution element, seals between said distribution element and said profiled members, three sets of gas passages being provided in said gas-distribution element and ending at the face of said prismatic cavity defined by said gas-distribution element, and a gas supply element, each said set of passages connecting a respective one of said prismatic volumes to said supply element.

7. A nozzle as in claim 1 in which said tensioning means comprises, for at least one end of each said strip, two locking jaws between which said strip end is held, a screw fast with said jaws, a fixed tubular member, said screw passing freely through said tubular member and having a portion projecting therefrom at the end of said tubular member remote from said jaws, a nut screw-threaded on said projecting portion, and a resilient compression element interposed between said nut and said end of said tubular member.

* * * * *